(12) United States Patent
Tsaur et al.

(10) Patent No.: US 11,508,716 B2
(45) Date of Patent: Nov. 22, 2022

(54) INTEGRATED CIRCUIT AND ELECTROSTATIC DISCHARGE PROTECTION METHOD

(71) Applicant: Realtek Semiconductor Corporation, Hsinchu (TW)

(72) Inventors: Tay-Her Tsaur, Hsinchu (TW); Cheng-Cheng Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 7 days.

(21) Appl. No.: 16/837,044

(22) Filed: Apr. 1, 2020

(65) Prior Publication Data

US 2021/0134786 A1   May 6, 2021

(30) Foreign Application Priority Data

Nov. 6, 2019   (TW) .................................. 108140318

(51) Int. Cl.
*H01L 27/02*   (2006.01)
*H01L 29/861*   (2006.01)

(52) U.S. Cl.
CPC ........ *H01L 27/0255* (2013.01); *H01L 29/861* (2013.01)

(58) Field of Classification Search
CPC ............... H01L 27/0255; H01L 29/861; H01L 29/0657; H01L 29/87; H01L 29/66121; H01L 29/74; H01L 29/66363
See application file for complete search history.

(56) References Cited

U.S. PATENT DOCUMENTS

| | | | | |
|---|---|---|---|---|
| 2007/0262386 A1* | 11/2007 | Gossner | .............. | H01L 29/7436 257/355 |
| 2009/0206367 A1* | 8/2009 | Gauthier, Jr. | ........ | H01L 29/7436 257/E21.388 |
| 2014/0097465 A1* | 4/2014 | Shrivastava | ........ | H01L 27/0817 257/133 |
| 2015/0014809 A1* | 1/2015 | Wang | ..................... | H01L 21/22 257/506 |

(Continued)

FOREIGN PATENT DOCUMENTS

| TW | 201032466 A | 9/2010 |
|---|---|---|
| TW | I359564 B | 3/2012 |

(Continued)

*Primary Examiner* — Wasiul Haider
(74) *Attorney, Agent, or Firm* — Locke Lord LLP; Tim Tingkang Xia, Esq.

(57) ABSTRACT

An integrated circuit includes a load circuit and an electrostatic discharge (ESD) circuit. The load circuit includes a first and a second I/O terminal. The ESD circuit is coupled to the first and the second I/O terminal. The ESD circuit includes a first protection circuit configured to conduct a first ESD current from the first to the second I/O terminal. The first protection circuit includes a first, a second, a third doped region, and a well. The first doped region is coupled to the first I/O terminal, and has a first conductive type. The well is coupled to the first doped region, and has a second conductive type different from the first conductive type. The second doped region is coupled to the well, and has the first conductive type. The third doped region couples the second doped region to the second I/O terminal, and has the second conductive type.

18 Claims, 7 Drawing Sheets

(56) References Cited

U.S. PATENT DOCUMENTS

2017/0366001 A1* 12/2017 Cao .................... H01L 27/0285
2020/0286889 A1*  9/2020 Salcedo .............. H01L 29/7391
2021/0050341 A1*  2/2021 Wang ................... H01L 29/861

FOREIGN PATENT DOCUMENTS

| TW | 201351604 A | 12/2013 |
| TW | 201423952 A |  6/2014 |
| TW | 201431065 A |  8/2014 |
| TW | 201909377 A |  3/2019 |

* cited by examiner

INTEGRATED CIRCUIT AND ELECTROSTATIC DISCHARGE PROTECTION METHOD

PRIORITY CLAIM AND CROSS-REFERENCE

The present application claims priority to Taiwan Application Serial Number 108140318, filed Nov. 6, 2019, which is herein incorporated by reference.

BACKGROUND

As the technology of integrated circuits (ICs) becomes advanced, the space between elements in the ICs becomes smaller. Therefore, it is increasingly easier for the electrostatic charge accumulating in the ICs due to various reasons to affect the peripheral elements. In order to avoid electrostatic discharge (ESD) damage, the function of ESD in the ICs becomes critical.

SUMMARY

An embodiment of the present disclosure is associated with an integrated circuit (IC) which includes a load circuit and an electrostatic discharge (ESD) circuit. The load circuit includes a first input/output (I/O) terminal and a second I/O terminal. The ESD circuit is coupled to the first I/O terminal and the second I/O terminal. The ESD circuit includes a first protection circuit. The first protection circuit is configured to conduct a first ESD current from the first I/O terminal to the second I/O terminal. The first protection circuit includes a first doped region, a well, a second doped region, and a third doped region. The first doped region is coupled to the first I/O terminal, and the first doped region has a first conductive type. The well is coupled to the first doped region, and the well has a second conductive type. The second conductive type is different from the first conductive type. The second doped region is coupled to the well, and the second doped region has the first conductive type. The third doped region is coupled the second doped region to the second I/O terminal, and the third doped region has the second conductive type.

An embodiment of the present disclosure is associated with an ESD method which includes the following operations: by a PNPN structure, conducting a first ESD current from a first (I/O) terminal to a second 110 terminal; and by a first fin field effect diode, conducting a second ESD current from the first I/O terminal to a first power rail. The PNPN structure is a fin structure.

In sum, the embodiments of the IC and the ESD method provided by the present disclosure are able to enhance the ESD protection function without increasing the layout area of the IC. Thus, the issue of significantly increasing the layout area can be avoided while adding new functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
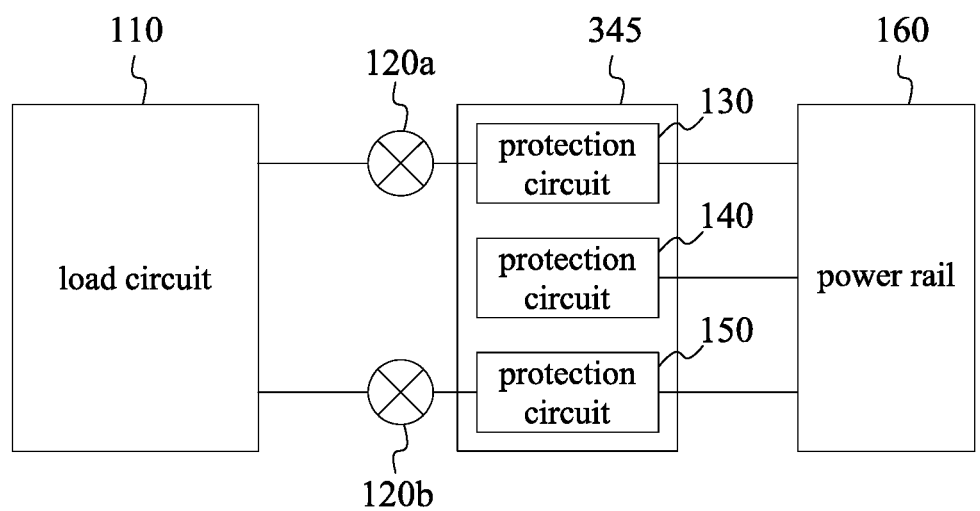
FIG. 1 is a schematic diagram of an integrated circuit (IC) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled," and the term "connected" may be termed as "electrically connected." "Coupled" and "connected" may also be used to indicate that two or more elements cooperate or interact with each other.

Reference is now made to FIG. 1. FIG. 1 is a schematic diagram of an integrated circuit (IC) 100 according to some embodiments of the present disclosure. As shown in FIG. 1, the IC 100 includes a load circuit 110, an electrostatic discharge (ESD) circuit 345, and a power rail 160. In some embodiments, the IC 100 has an ESD function to prevent ESD damage to the IC 100.

As shown in FIG. 1, the load circuit 110 includes an input/output (I/O) terminal 120a and an I/O terminal 120b. The I/O terminal 120a and the I/O terminal 120b are coupled to the ESD circuit 345, and the ESD circuit 345 is further coupled to the power rail 160.

In some embodiments, the load circuit 110 transmits power and/or signals through the I/O terminal 120a and the I/O terminal 120b. In some embodiments, the power and/or signals transmitting through the I/O terminal 120a and the I/O terminal 120b are the same. In some other embodiments, the power and/or signals transmitting through the I/O terminal 120a and the I/O terminal 120b are different.

In some embodiments, the ESD circuit 345 is configured to connect the I/O terminal 120a, the I/O terminal 120b, and the power rail 160 of the load circuit 110. The ESD circuit 345 is configured to protect the load circuit 110 from damage due to the electrostatic discharge. The ESD circuit 345 includes a protection circuit 130, a protection circuit 140, and a protection circuit 150. The details of the ESD circuit 345 will be described below with reference to FIGS. 2-6.

In some embodiments, the power rail 160 is implemented by a metal line, and is configured to receive a supply voltage.

Figure 2:
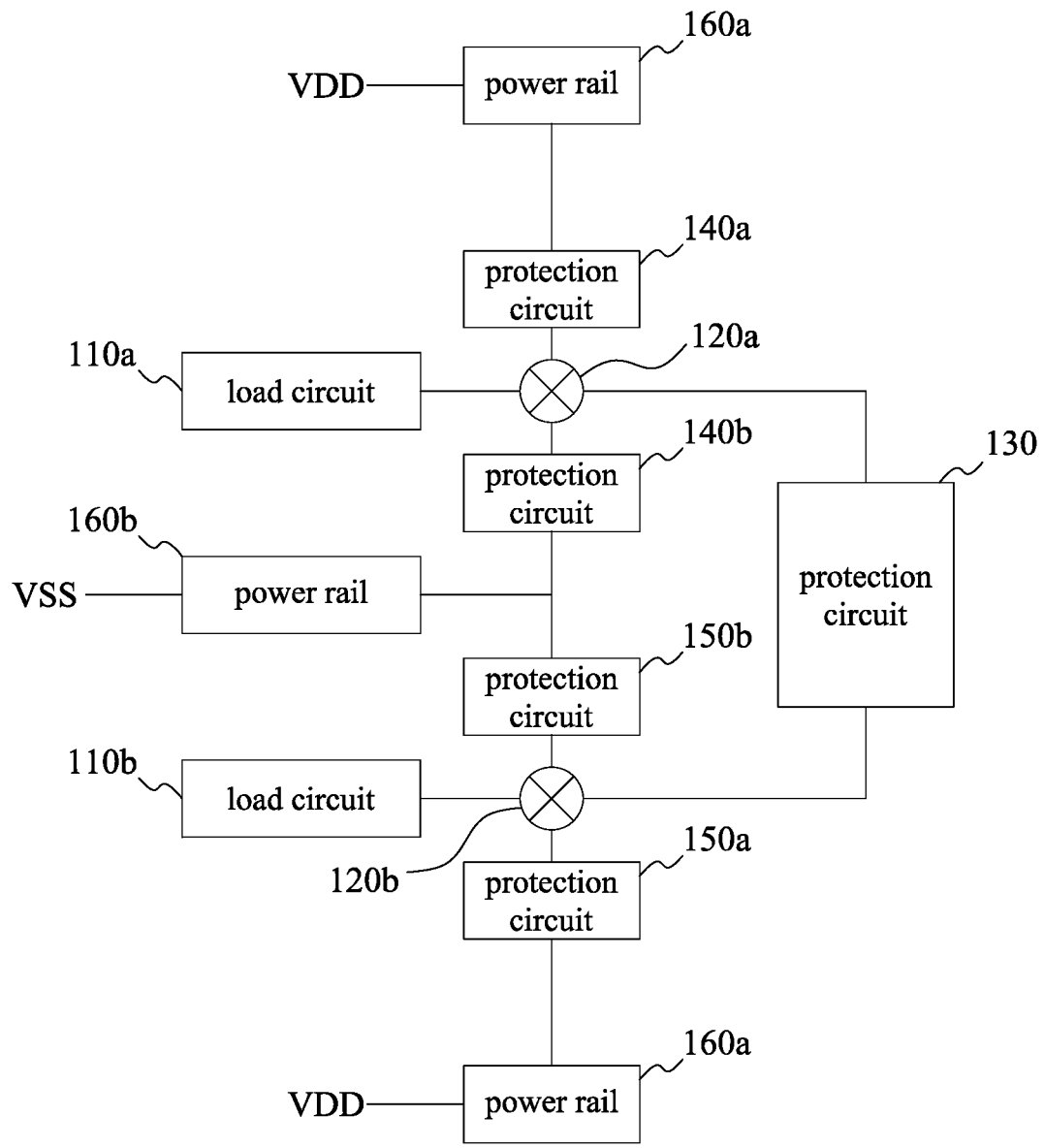
FIG. 2 is a detailed schematic diagram of the IC illustrated in FIG. 1 in accordance with some embodiments.

Reference is made to FIG. 2. FIG. 2 is a detailed schematic diagram of the IC 100 illustrated in FIG. 1 according to some embodiments of the present disclosure. As shown in FIG. 2, the IC 100 includes a load circuit 110a, a load circuit 110b, a protection circuit 130, a protection circuit 140a, a protection circuit 140b, a protection circuit 150a, a protection circuit 150b, a power rail 160a, and a power rail 160b. The load circuit 110 includes the load circuit 110a and the load circuit 110b. The protection circuit 140 includes the protection circuit 140a the protection circuit 140b, and the protection circuit 150 includes the protection circuit 150a and the protection circuit 150b. The power rail 160 includes the power rails 160a and the power rail 160b.

As shown in FIG. 2, the load circuit 110a includes an I/O terminal 120a, and the load circuit 110b includes an I/O terminal 120b. The protection circuit 130 is coupled between the I/O terminal 120a and the I/O terminal 120b. The protection circuit 140a and the protection circuit 150a are coupled the I/O terminal 120a and the I/O terminal 120b to the power rail 160a, respectively. The protection 140b and the protection circuit 150b are coupled the I/O terminal 120a and the I/O terminal 120b to the power rail 160b, respectively.

In some embodiments, the protection circuit 130 is configured to conduct an ESD current from the I/O terminal 120a to the I/O terminal 120b, so as to protect the load circuit 110a and a peripheral from electrostatic charge accumulating on the load circuit 110a. The protection circuit 130 is also configured to conduct an ESD current from the I/O terminal 120b to the I/O terminal 120a, so as to protect the load circuit 110b and a peripheral from electrostatic charge accumulating on the load circuit 110b.

In some embodiments, the protection circuit 140a and the protection circuit 150a are configured to conduct the ESD current from the I/O terminal 120a and the I/O terminal 120b to the power rail 160a, respectively, and the protection circuit 140b and the protection circuit 150h are configured to conduct the ESD current respectively from to the I/O terminal 120a and the I/O terminal 120b to the power rail 160b.

In some embodiments, the power rail 160a is configured to receive the supply voltage VDD, and the power rail 160b is configured to receive the supply voltage VSS. In some embodiments, the supply voltage VDD is a system high voltage, and the supply voltage VSS is a ground voltage.

Figure 3:
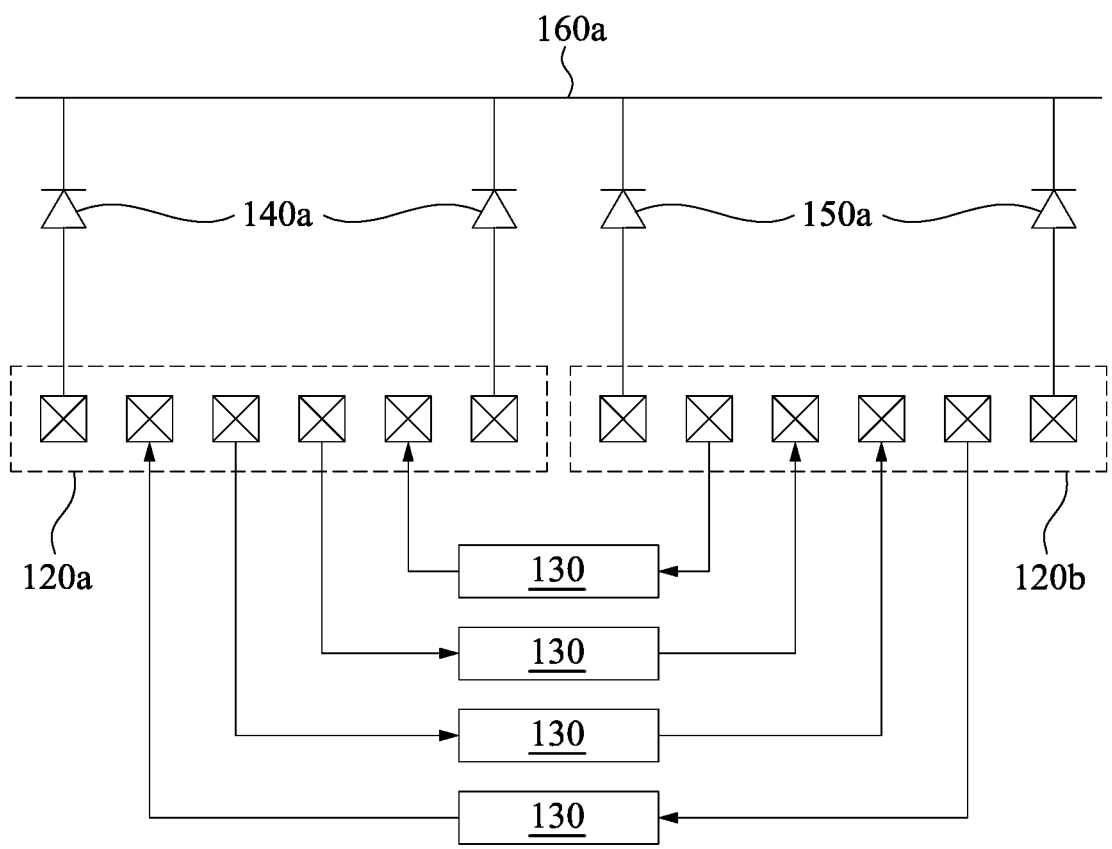
FIG. 3 is a schematic diagram of a partial circuit of the IC illustrated in FIG. 1 in accordance with some embodiments.

Reference is made to FIG. 3. FIG. 3 is a schematic diagram of a partial circuit 300 of the IC 100 illustrated in FIG. 1 according to some embodiments of the present disclosure. As shown in FIG. 3, the circuit 300 includes the I/O terminal 120a, the I/O terminal 120b, the power rail 160a, the protection circuit 130, the protection circuit 140a, and the protection circuit 150a.

In some embodiments, the I/O terminal 120a and the I/O terminal 120b include multiple pins, and each of the pins is coupled to the protection circuit 130, the protection circuit 140a, or the protection circuit 150a. In some embodiments, the pins of the I/O terminal 120a are connected to each other to form a short circuit, and the pins of the I/O terminal 120b are connected to each other to form a short circuit. In FIG. 2, the protection circuit 140b and the protection circuit 150b are respectively coupled the I/O terminal 120a and the I/O terminal 120b, and both are connected to the power rail 160b, and this configuration is similar to the configuration of the protection circuit 140a, the protection circuit 150a, and the power rail 160a. For ease of understanding, only the configuration of the protection circuit 140a, the protection circuit 150a, and the power rail 160a is shown in FIG. 3.

In some embodiments, the protection circuit 130 includes multiple parts which are independent of each other, and each part couples a pin of the I/O terminal 120a to a pin of the I/O terminal 120b. In some embodiments, each part of the protection circuit 130 has an orientation. As shown in FIG. 3, the topmost part of the protection circuit 130 is configured to conduct the ESD current from the I/O terminal 120b to the I/O terminal 120a, and the middle parts of the protection circuit 130 are configured to conduct the ESD current from the I/O terminal 120a to the I/O terminal 120b. The arrows indicate the different directions of conduction.

In some embodiments, the protection circuit 140a and the protection circuit 150a are implemented by diodes. Alternatively stated, the protection circuit 140a and the protection circuit 150a also have orientations. The diodes shown in FIG. 3 are provided for illustrative purposes. Various implementations of diodes are within the contemplated scope of the present disclosure. For example, in various embodiments, the diodes are implemented by fin field-effect diodes.

Figure 4A:
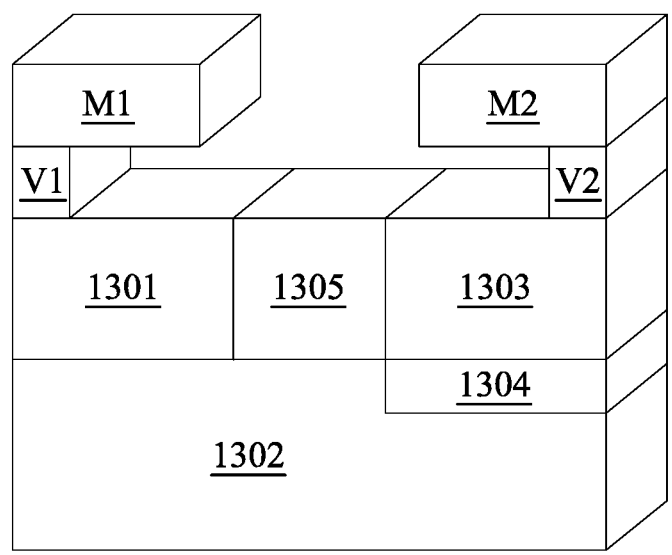
FIG. 4A is a schematic diagram of the structure of a protection circuit in accordance with some embodiments.

Reference is made to FIG. 4A. FIG. 4A is a schematic diagram of the structure of the protection circuit 130 according to some embodiments of the present disclosure. As shown in FIG. 4A, the protection circuit 130 includes a doped region 1301, a well 1302, a doped region 1303, a doped region 1304, an isolation region 1305, a via V1, a via V2, a metal line M1, and a metal line M2.

As shown in FIG. 4A, the doped region 1301, the doped region 1303, and the isolation region 1305 are disposed on the well 1302. The isolation region 1305 is disposed between the doped region 1301 and the doped region 1303, and the doped region 1304 and the doped region 1301 do not directly contact to each other. The doped region 1301 is coupled to the metal line M1 through the via V1. The doped region 1303 is coupled to the metal line M2 through the via V2.

In some embodiments, the doped region 1301, the well 1302, the doped region 1303, and the doped region 1304 are semiconductors. A current path is formed within the protection circuit 130, and the current path extends from the metal M1, through the via V1, the doped region 1301, the well 1302, the doped region 1304, the doped region 1303, and the via V2, and to the metal line M2 sequentially. The protection circuit 130 is coupled to the I/O terminal 120a and the I/O terminal 120b via the metal line M1 and the metal line M2.

In some embodiments, the doped region 1301 and the doped region 1304 have a first conductive type, and the well 1302 and the doped region 1303 have a second conductive type. In some embodiments, the first conductive type is P type, and the second conductive type is N type. In other words, the protection circuit 130 has a PNPN structure. In some other embodiments, the first conductive type is N type, and the second conductive type is P type. In other words, in such other embodiments, the protection circuit 130 has an NPNP structure.

In some embodiments, a doping concentration of the doped region 1301 is larger than a doping concentration of the well 1302, and a doping concentration of the doped region 1303 is larger than the doping concentration of the well 1302. In some embodiments, the doped region 1304 is formed by performing an ion implantation process on a surface of the well 1302.

In some embodiments, the protection circuit 130 is a fin structure, in which the doped region 1301, the isolation region 1305, and the doped region 1303 are formed as a fin. In some other embodiments, the protection circuit 130 does not include the isolation region 1305. In some embodiments, the isolation region 1305 is formed by performing a shallow trench isolation process. There is only one fin structure shown in FIG. 4A, however, the present disclosure is not limited thereto. In some embodiments, the protection circuit 130 is formed by multiple fin structures. For example, each part of the protection circuit 130 shown in FIG. 3 is formed as a fin structure.

Figure 4B:
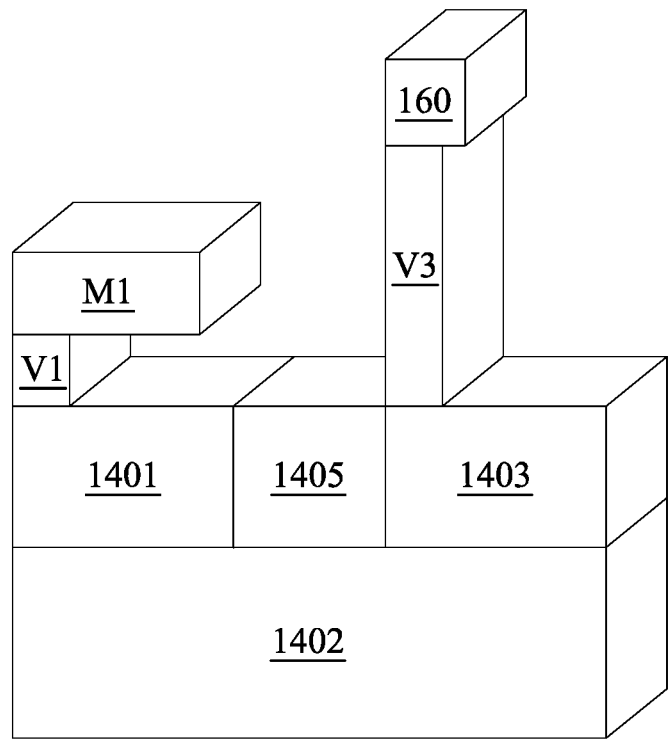
FIG. 4B is a schematic diagram of the structure of the protection circuit in accordance with some other embodiments.

Reference is made to FIG. 4B. FIG. 4B is a schematic diagram of the structure of the protection circuit 140 according to some other embodiments of the present disclosure. As shown in FIG. 4B, the protection circuit 140 includes a doped region 1401, a well 1402, a doped region 1403, an isolation region 1405, a via V1, a via V3, and a metal line M1.

As shown in FIG. 4B, the doped region 1401, the doped region 1403, and the isolation region 1405 are disposed on the well 1402. The isolation region 1405 is disposed between the doped region 1401 and the doped region 1403. The doped region 1401 is coupled to the metal line M1 through the via V1. The doped region 1403 is coupled to the power rail 160 through the via V3.

In some embodiments, the doped region 1401, the well 1402, the doped region 1403, the isolation region 1405, the via V1, and the metal line M1 are similar to the doped region 1301, the well 1302, the doped region 1303, the isolation region 1305, the via V1, and the metal line M1 shown in FIG. 4A. Accordingly, these elements are not further detailed herein.

In some embodiments, a current path is formed within the protection circuit 140, and the current path extends from the metal M1, through the via V1, the doped region 1401, the well 1402, the doped region 1403, and the via V3, and to the power rail 160 sequentially. The protection circuit 140 is coupled to the I/O terminal 120a via the metal line M1.

Compared to the protection circuit 130 shown in FIG. 4A, the power rail 160 coupling to the protection circuit 140 and the metal line M1 are disposed at different heights. As shown in FIG. 4B, the via V3 is longer than the via V1.

In some embodiments, the protection circuit 140 is a fin structure, in which the doped region 1401, the isolation region 1405, and the doped region 1403 are formed as a fin. In some embodiments, the protection circuit 140 is implemented by fin field-effect diodes.

The protection circuit 150 and the protection circuit 140 shown in FIG. 4B are substantially the same. Compared to the protection circuit 140 in FIG. 4B, the protection circuit 150 is coupled to the I/O terminal 120b via the metal line M1. Accordingly, these elements are not further detailed herein.

Figure 5:
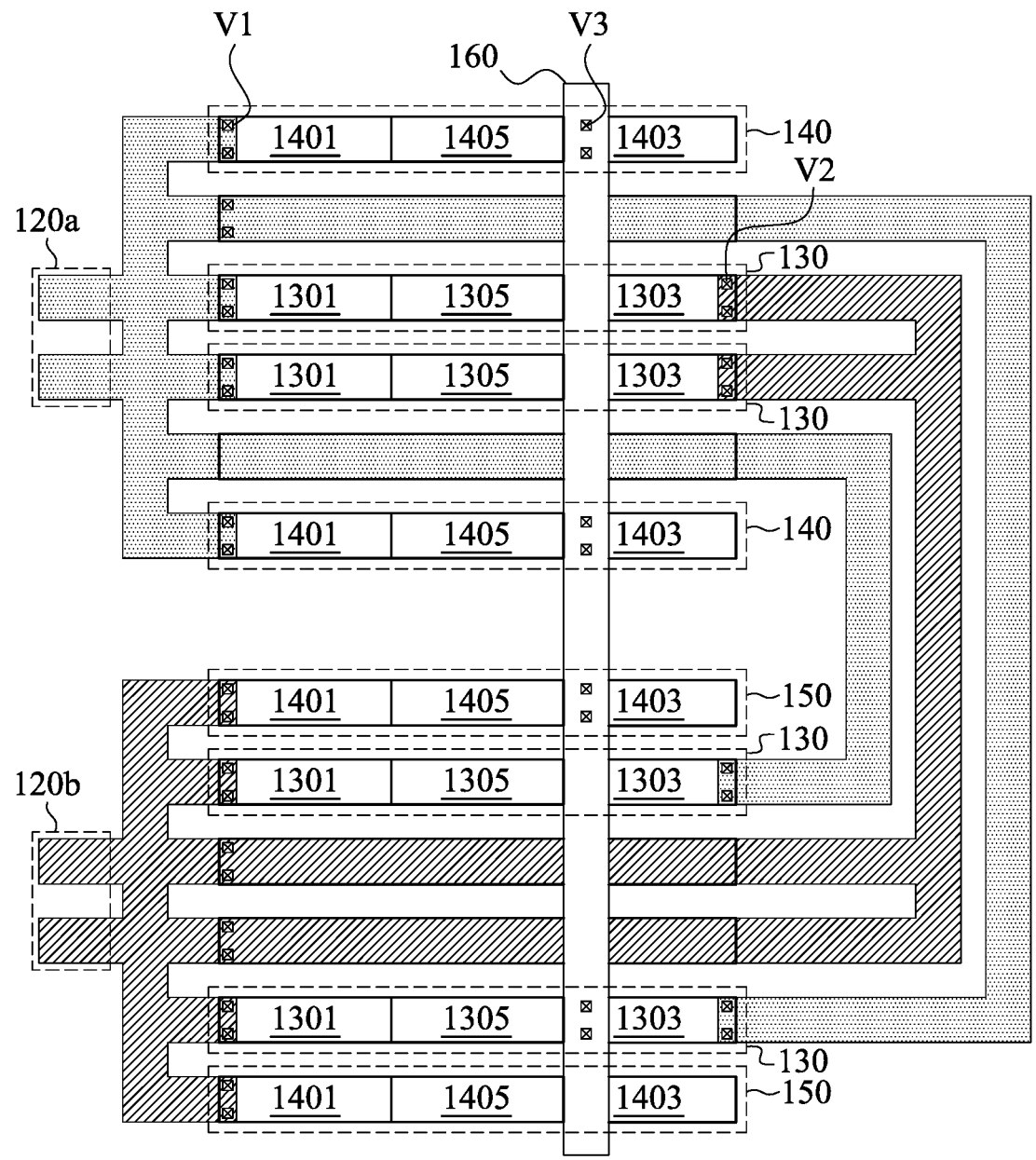
FIG. 5 is a detailed schematic diagram of the IC in accordance with some other embodiments.

Reference is made to FIG. 5. FIG. 5 is a detailed schematic diagram of the IC 100 according to some other embodiments of the present disclosure. As shown in FIG. 5, the IC 100 includes an I/O terminal 120a, an I/O terminal 120b, a protection circuit 130, a protection circuit 140, a protection circuit 150, and a power rail 160.

In some embodiments, the protection circuit 130, the protection circuit 140, and the protection circuit 150 are multiple fins structures, and the fins structures are parallel arranged and have substantially the same area. As shown in FIG. 5, the I/O terminal 120a is coupled to the I/O terminal 120b through the protection circuit 130, and coupled to the power rail 160 through the protection circuit 140. The I/O terminal 120b is coupled to the I/O terminal 120a through the protection circuit 130, and coupled to power rail 160 through the protection circuit 150. The power rail 160 and the fin structures are parallel arranged.

In some embodiments, the protection circuit 130 and the protection circuit 140 conduct the ESD current from the I/O terminal 120a to the I/O terminal 120b and the power rail 160, respectively, and the protection circuit 130 and the protection circuit 150 conduct the ESD current from the I/O terminal 120b to the I/O terminal 120a and the power rail 160, respectively. In some embodiments, ESD currents transmitting in different paths are different. In some other embodiments, at least part of ESD currents transmitting in different paths are the same.

In some embodiments, the protection circuit 130 and the protection circuits 140/150 originally have the same structure. During manufacture, the structure of the protection circuit 130 is formed by performing an ion implantation process on the well 1402 of the protection circuit 140 and/or the protection circuit 150.

For ease of understanding, in FIG. 5, the coupling paths between the I/O terminal 120a and the I/O terminal 120b are illustrated outside of the fin structures (i.e., the protection circuit 130, the protection circuit 140, and the protection circuit 150). However, the present disclosure is not limited thereto. For example, in some embodiments, the coupling paths between the I/O terminal 120a and the I/O terminal 120b do not cover an additional area outside of the protection circuit 130, the protection circuit 140, and the protection circuit 150.

In some approaches, the ESD circuit arranged between two output terminals uses an additional layout area, thus the area of the IC is increased. Compared to such approaches, the protection circuit 130 is formed by adding an ion implantation process on the protection circuits 140/150, and there is no extra area consumption in the original layout area. Therefore, the area of the IC is not increased.

Figure 6:
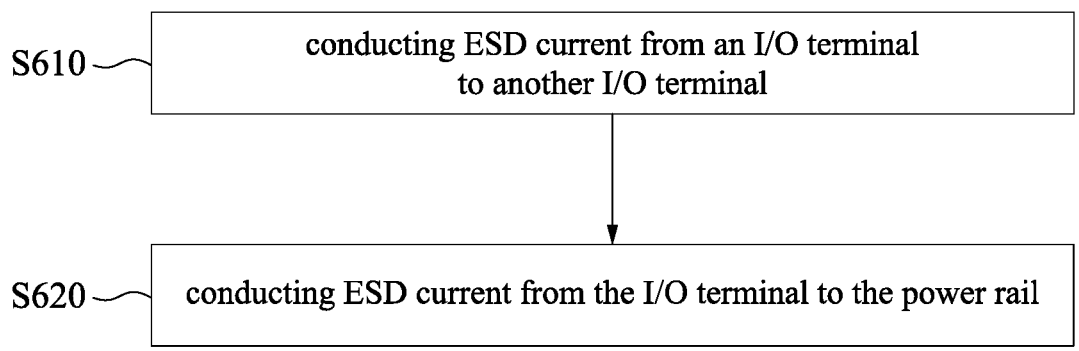
FIG. 6 is a flow chart of an ESD method in accordance with some embodiments.

Reference is made to FIG. 6. FIG. 6 is a flow chart of an ESD method 600 according to some embodiments of the present disclosure. The ESD method 600 includes an operation S610 and an operation S620.

In operation S610, an ESD current is conducted from the I/O terminal 120a to the I/O terminal 120b. Electrostatic charge accumulating on the I/O terminal 120a of the load circuit 110 is conducted to the I/O terminal 120b by the PNPN fin structure which is implemented as the protection circuit 130, so as to protect the I/O terminal 120a and a peripheral thereof from ESD.

In some embodiments, in the operation S610, tile ESD current is also conducted from the I/O terminal 120b to the I/O terminal 120a. The operation and the function are similar to conducting the ESD current from the I/O terminal 120a to the I/O terminal 120b. Accordingly, this procedure is not further detailed herein.

In operation S620, the ESD current is conducted from the I/O terminal 120a to the power rail 160. The electrostatic charge accumulating on the I/O terminal 120a of the load circuit 110 is conducted to the power rail 160 by the fin field-effect diodes which are implemented as the protection circuit 140 and the protection circuit 150, so as to protect the I/O terminal 120a and a peripheral thereof from ESD.

In some embodiments, conducting the ESD current to the power rail 160 includes conducting the ESD current from the I/O terminal 120a to the power rail 160a and the power rail 160b by different fin field-effect diodes.

In some embodiments, in operation S620, the ESD current is also conducted from the I/O terminal 120b to the power rail 160. The operation and the function are similar to conducting the ESD current from the I/O terminal 120a to the power rail 160. Accordingly, this procedure is not further detailed herein.

The above illustrations include exemplary operations, but the operations are not necessarily performed in the order shown. Operations may be added, replaced, changed in order, and/or eliminated as appropriate, in accordance with the spirit and scope of various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a load circuit comprising a first input/output (I/O) terminal and a second I/O terminal; and
an electrostatic discharge (ESD) circuit coupled to the first I/O terminal and the second I/O terminal, wherein the ESD circuit comprises a first protection circuit,
wherein the first protection circuit is configured to conduct a first ESD current from the first I/O terminal to the second I/O terminal, and the first protection circuit comprises:
a first doped region coupled to the first I/O terminal, wherein the first doped region has a first conductive type;
a well coupled to the first doped region, wherein the well has a second conductive type, wherein the second conductive type is different from the first conductive type;
a second doped region coupled to the well, wherein the second doped region has the first conductive type, wherein the second doped region is disposed on a surface of the well and extended into the well; and
a third doped region which couples the second doped region to the second I/O terminal, wherein the third doped region has the second conductive type,
wherein an isolation region is disposed between the first doped region and the third doped region, and the first ESD current flows from the first I/O terminal through the first doped region, the well, the second doped region and the third doped region to the second I/O terminal.

2. The IC of claim 1, further comprising:
a power rail coupled to the ESD circuit,
wherein the ESD circuit further comprises:
a second protection circuit configured to conduct a second ESD current from the first I/O terminal to the power rail; and
a third protection circuit configured to conduct a third ESD current from the second I/O terminal to the power rail.

3. The IC of claim 2, wherein the ESD circuit is implemented by a plurality of fin structures, and the first protection circuit, the second protection circuit, and the third protection circuit are implemented by three different fin structures of the plurality of fin structures, respectively.

4. The IC of claim 2, wherein the second protection circuit and the third protection circuit are fin field-effect diodes.

5. The IC of claim 2, wherein the first conductive type is P type, and the second conductive type is N type.

6. The IC of claim 1, wherein a doping concentration of the first doped region is larger than a doping concentration of the well, a doping concentration of the third doped region is larger than the doping concentration of the well, and a doping concentration of the second doped region is larger than the doping concentration of the third doped region.

7. The IC of claim 1, further comprising:
a first power rail coupled to the ESD circuit; and
a second power rail coupled to the ESD circuit,
wherein the ESD circuit further comprises:
a second protection circuit configured to conduct a second ESD current from the first I/O terminal to the first power rail; and
a third protection circuit configured to conduct a third ESD current from the first I/O terminal to the second power rail.

8. The IC of claim 7, wherein the ESD circuit further comprises:
a fourth protection circuit configured to conduct a fourth ESD current from the second I/O terminal to the first power rail; and
a fifth protection circuit configured to conduct a fifth ESD current from the second I/O terminal to the second power rail.

9. The IC of claim 7, wherein the first protection circuit, the second protection circuit, and the third protection circuit are implemented by three different fin structures of a plurality of fin structures, respectively, wherein the plurality of fin structures are arranged perpendicular to the first power rail, and the plurality of fin structures are arranged perpendicular to the second power rail.

10. The IC of claim 1, wherein the first protection circuit is formed by a plurality of fin structures.

11. The IC of claim 1, wherein the first doped region is not directly in contact with the second doped region.

12. The IC of claim 1, wherein the first protection circuit has a PNPN structure.

13. An electrostatic discharge (ESD) method, comprising:
a PNPN structure, conducting a first ESD current from a first input/output (I/O) terminal to a second I/O terminal; and
a first fin field-effect diode, conducting a second ESD current from the first I/O terminal to a first power rail,
wherein the PNPN structure is a fin structure, and the PNPN structure comprises:
a first doped region coupled to the first I/O terminal, wherein the first doped region has a P type conductive type;
a well coupled to the first doped region, wherein the well has a N type conductive type;

a second doped region coupled to the well, wherein the second doped region has the P type conductive type, wherein the second doped region is disposed on a surface of the well and extended into the well by performing an ion implantation process; and a third doped region which couples the second doped region to the second I/O terminal, wherein the third doped region has the N type conductive type, wherein an isolation region is disposed between the first doped region and the third doped region, and the first ESD current flows from the first I/O terminal through the first doped region, the well, the second doped region and the third doped region to the second I/O terminal.

14. The ESD method of claim 13, further comprising:
a second fin field-effect diode, conducting a third ESD current from the first I/O terminal to a second power rail.

15. The ESD method of claim 13, wherein the PNPN structure and the first fin field-effect diode are disposed in parallel to each other.

16. The ESD method of claim 13, wherein the PNPN structure and the first power rail are disposed in parallel to each other.

17. The ESD method of claim 13, wherein conducting the first ESD current from the first I/O terminal to the second I/O terminal is configured to protect a load circuit coupled to the first I/O terminal, to conduct accumulated charge as the first ESD current to the second I/O terminal.

18. The ESD method of claim 13, wherein an area of the PNPN structure is the same as an area of the first fin field-effect diode.

* * * * *